United States Patent [19]

Ohashi et al.

[11] Patent Number: 5,006,883
[45] Date of Patent: Apr. 9, 1991

[54] IMAGE FORMING APPARATUS

[75] Inventors: Kunio Ohashi; Shoichi Nagata, both of Nara, Japan

[73] Assignee: Sharp Kabushiki Kaisha, Osaka, Japan

[21] Appl. No.: 303,627

[22] Filed: Jan. 27, 1989

[30] Foreign Application Priority Data

Jan. 27, 1988 [JP] Japan .................. 63-16648

[51] Int. Cl.⁵ ............................................. G03B 27/52
[52] U.S. Cl. ...................................... 355/27; 355/100; 355/38
[58] Field of Search ...................... 355/38, 68, 27, 28, 355/45, 241, 100, 106; 430/138

[56] References Cited

U.S. PATENT DOCUMENTS

| 2,293,425 | 8/1942 | Dammond | 355/68 |
| 2,961,921 | 11/1960 | Lingg et al. | 355/38 |
| 3,045,540 | 7/1962 | Caps et al. | 355/28 |
| 3,283,647 | 11/1966 | Fairbanks et al. | 355/28 |
| 3,649,118 | 3/1972 | Yano et al. | 355/68 X |
| 4,399,209 | 8/1983 | Sanders et al. | 430/211 X |
| 4,601,571 | 7/1986 | Yuasa et al. | 355/68 X |
| 4,714,943 | 12/1987 | Sakakihara et al. | 355/27 |
| 4,760,426 | 7/1988 | Taniguchi et al. | 355/27 |
| 4,792,829 | 12/1988 | Firmani | 355/68 |
| 4,794,425 | 12/1988 | Sakai et al. | 355/27 |

*Primary Examiner*—Michael L. Gellner
*Assistant Examiner*—D. Rutledge
*Attorney, Agent, or Firm*—Flehr, Hohbach, Test, Albritton & Herbert

[57] ABSTRACT

An image forming apparatus of a static exposure type uses a static exposure-type optical system to expose a photosensitive sheet to form a latent image thereon such that a visible image is produced from such a latent image. An exposure detector detects the amount of light energy to which the photosensitive sheet is exposed and the exposure of the photosensitive sheet to image forming light is continued by a control device until the cumulative light energy as measured by the exposure detector reaches a preset value.

6 Claims, 7 Drawing Sheets

IMAGE FORMING APPARATUS

BACKGROUND OF THE INVENTION

This invention relates to an image forming apparatus for forming an image by using a photosensitive member such as a sheet with a surface coated with microcapsules encapsulating a colorless dye and a light-curable agent which hardens upon exposure to light and, more particularly, to an image forming apparatus which forms an image by exposing such a photosensitive sheet to image-forming light by means of a static exposure-type optical system.

Japanese Patent Publication Tokkai 58-88739 has disclosed a method of forming an image by using a photosensitive sheet with one surface of its sheet-like base material coated with microcapsules encapsulating a colorless dye of a specified type and a light-curable agent which hardens upon exposure to light. If such a photosensitive sheet is exposed to image-forming light such as reflected light from a document, only those of the microcapsules on the photosensitive sheet which have been exposed to light become hard selectively and a latent image corresponding to the exposed image is formed on the photosensitive sheet. If an image transfer sheet with a surface coated with a developing agent having a chromogenic effect of the colorless dye encapsulated in the microcapsules is superposed on such a photosensitive sheet with a latent image thus formed thereon and compressed together, those of the microcapsules which have not been hardened rupture, causing the colorless dye encapsulated therein to flow out thereof. The colorless dye which flows out of these ruptured microcapsules reacts with the developing agent on the image transfer sheet, forming a desired image on the image transfer sheet.

Image forming apparatus making use of a photoconductive body are also commonly known. With such an apparatus, an electrostatic image is formed by exposing a photoconductive body to image-forming light and, after toner is electrostatically attached to the electrostatic latent image, the toner image thus formed is transferred onto an image transfer sheet.

With such an image forming apparatus, reflected light from a document or transmitted light through a slide is used as the image-forming light for exposing a photosensitive sheet or a photoconductive body to form a latent image thereon. Such image-forming light is usually directed onto a photosensitive body either by a static exposure method or by a slit exposure method. The static exposure method is advantageous because it does not require complicated mechanisms for a scan by its optical system, while the slit exposure method does require such a scan. Thus, the control of the optical system is easier with the static exposure method. With the static exposure method, furthermore, the original document or slide has only to be exposed all at once for a specified length of time and this makes it possible to reduce the total time required for the exposure, compared with the slit exposure method whereby each part of an original must be exposed for a specified length of time. Thus, the overall processing time required for forming an image can be reduced by the static exposure method.

For such an image-forming exposure, use is generally made of light emitted from a source such as a tungsten lamp but such light sources deteriorate with time. The total amount of light may decrease and the spectroscopic distribution characteristic may change. When exposure is made by a static exposure method, the entire document or slide is exposed to light for a specified length of time. Although this presents no problem while the light source is still new and has not deteriorated yet, an underexposure may result if the light output from a deteriorated source is smaller but the same exposure time is used. An underexposed image is darker and its quality is low. When a full-color image is formed, a change in the spectroscopic distribution characteristic of the light source due to deterioration with time may adversely affect the color balance of the formed image. Light sources generally used for providing image-forming light usually become weak with time in the shorter wavelength region and images formed with such a deteriorated light source tend to be strong in magenta and cyanic.

In image forming apparatus, it is not only the light source that deteriorates with time. Optical components such as mirrors and lenses used for image formation become dirty and otherwise deteriorated, adversely affecting the reflectivity of the mirrors and the transmissivity of the lenses. For this reason, too, there tends to be an underexposure if an image is exposed for the same length of time and the result is a uniformly dark image.

SUMMARY OF THE INVENTION

It is therefore an object of the present invention to eliminate such drawbacks by providing a static exposure-type image forming apparatus adapted to continue an image forming exposure until the amount of image forming light received by its photosensitive body reaches a preset necessary level.

The present invention relates to an image forming apparatus of a static exposure type which makes use of a static exposure-type optical system to expose its photosensitive body to form a latent image thereon and to form a visible image from such a latent image formed on the photosensitive body and is comprised of an exposure detector for detecting exposure of the photosensitive body when it is exposed to image forming light and a control device for using this exposure detector to continue the exposure by the optical system until the amount of light energy of the image forming exposure reaches a specified value. According to a preferred embodiment of the present invention, this specified value is preset according to the characteristics of the photosensitive body. According to another preferred embodiment of the present invention, it is inputted through a specified input device. The photosensitive body may preferably take the form of a photosensitive sheet with a surface of its sheet-like base material coated with microcapsules encapsulating a light-curable agent and a colorless dye. According to still another preferred embodiment of the present invention, each of these microcapsules encapsulates therein one of a plurality of kinds of light-curable agents each hardening upon exposure to light in a specified wavelength range and a colorless dye which produces a color complementary to the color to which the encapsulated light-curable agent is photosensitive. The optical system may preferably be adapted to expose this photosensitive sheet at once to light in the entire visible wavelength range. According to still another preferred embodiment of the present invention, the optical system may be adapted to decompose light in the entire visible wavelength range into blue light, green light and red light, effecting exposure to each of these beams of light.

With an image forming apparatus thus structured, the amount of image forming light to which the photosensitive body is exposed is monitored and the image forming exposure is continued until the energy value of the light forming exposure reaches a preset level. While the light source, the mirrors and the lens are still new, the required amount of energy can be obtained within a relatively short length of time and the image forming exposure can be completed relatively quickly. As the light intensity of the light source decreases with time or as the mirrors and the lens become dirty with time and the reflectivity of the mirrors and the transmissivity of the lens become adversely affected, it may take a longer time to obtain the present level of light energy but the required amount of light energy is reliably received by exposure. In other words, if an amount of light necessary for image formation is preliminarily set, a clear image can be obtained independently of the deterioration of the light source, etc. Alternatively, the target level of light energy may be inputted through an input device, depending on the desired density of the image to be obtained. For example, if the target amount of light energy is set higher than normal, lighter images can be obtained. If it is set lower than normal, on the other hand, darker images can be formed.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION OF PREFERRED EMBODIMENTS

Figure 1:
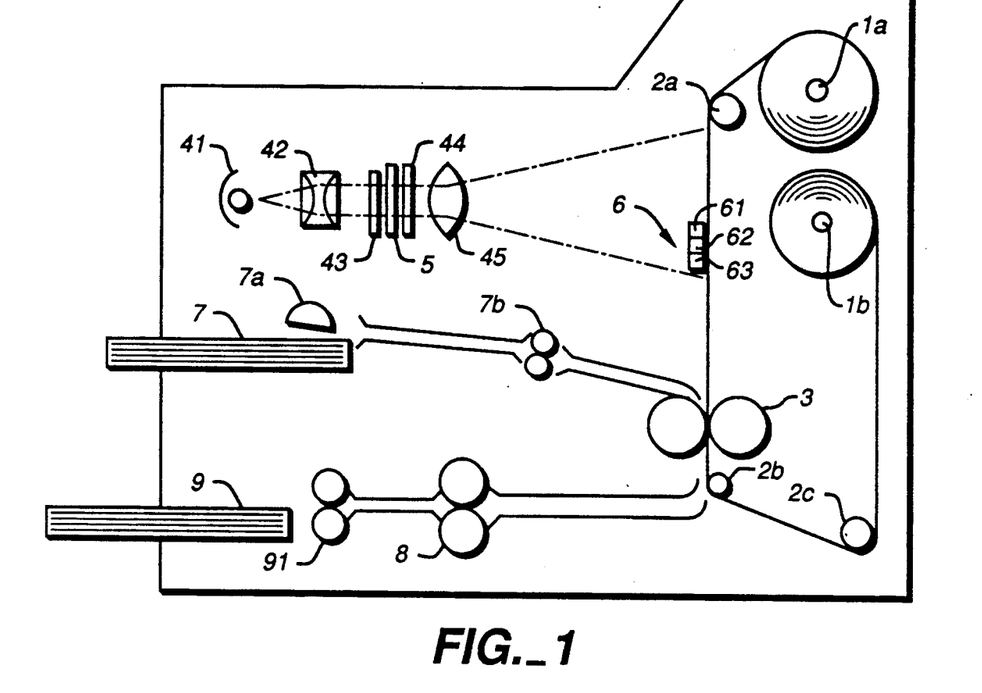
FIG. 1 is a schematic drawing showing the structure of a copier serving as an example of image forming apparatus embodying the present invention.
Figure 2:
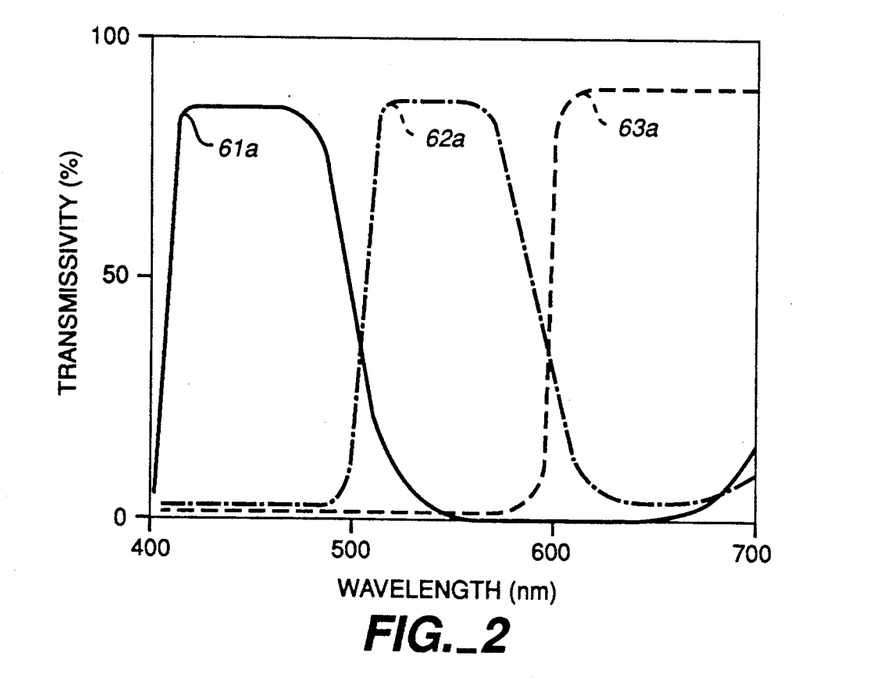
FIG. 2 is a graph showing the characteristics of selectively transmissive filters of an exposure detector used in this copier.

FIG. 1 shows schematically the structure of a copier serving as an example of image forming apparatus embodying the present invention and adapted to form a full-color image by exposing a photosensitive sheet to a light beam spanning the entire visible wavelength range.

At one side in the upper part of the housing structure is the photosensitive sheet in the form of a roll and wound around a holding roller 1a. This photosensitive sheet is passed over a guide roller 2a and pulled out substantially vertically. After it passes between a pair of pressure rollers 3, it passes over two other guide rollers 2b and 2c to change its direction of motion and wound up around a take-up roller 1b disposed below the holding roller 1a.

This photosensitive sheet is for forming full-color images and its sheet-like base material has one of its surfaces coated with three types of uniformly distributed microcapsules. These three types are: (1) what is hereinafter referred to as the Y capsules, encapsulating a light-curable agent which hardens upon exposure to light in a blue wavelength range and a colorless dye (chromogenic agent) which reacts with a developing agent to produce yellow which is complementary to blue, (2) what is hereinafter referred to as the M capsules, encapsulating a light-curable agent which hardens upon exposure to light in a green wavelength range and a colorless dye which reacts with the developing agent to produce magenta which is complementary to green, and (3) what is hereinafter referred to as the C capsules, encapsulating a light-curable agent which hardens upon exposure to light in a red wavelength range and a colorless dye which reacts with the developing agent to produce cyanic which is complementary to red. When the photosensitive sheet thus coated with these three types of microcapsules is exposed to a beam of image forming light containing color information and spanning the entire visible wavelength range, the Y, M and C capsules are selectively hardened by exposure to light in their corresponding wavelength ranges and form on the photosensitive sheet a latent image with color information.

Disposed inside the copier housing structure opposite from the holding roller 1a is a light source 41 comprising a halogen tungsten lamp. Light emitted from this source 41 is transmitted through color films to be described below and made incident on the photosensitive sheet pulled out from the holding roller 1a and forms a latent image thereon.

The optical path of the light from the source 41 passes sequentially through a condenser lens system 42, a shutter 43, a slide film holder 5, a color adjusting filter unit 44 and a focussing lens 45. The light source 41, the condenser lens system 42, the shutter 43, the color adjusting filter unit 44, the focussing lens 45 and their control units together form what is herein referred to as the optical system.

A color film, for example, may be set inside the slide film holder 5 such that the light from the source 41 is condensed by the condenser lens system 42 and is projected thereon after passing through the shutter 43. The transmitted light through this color film passes through the color adjusting filter unit 44, is directed onto the photosensitive sheet by the focussing lens 45 and forms a focussed image thereon, causing the Y, M and C capsules thereon to selectively harden to form a latent image with color information. The color adjusting filter unit 44 includes three filters each transmitting blue, green and red light. The ratio of blue, green and red light to be projected on the photosensitive sheet is determined by the degrees by which these filters are inserted into the optical path of the image forming light.

Figure 3:
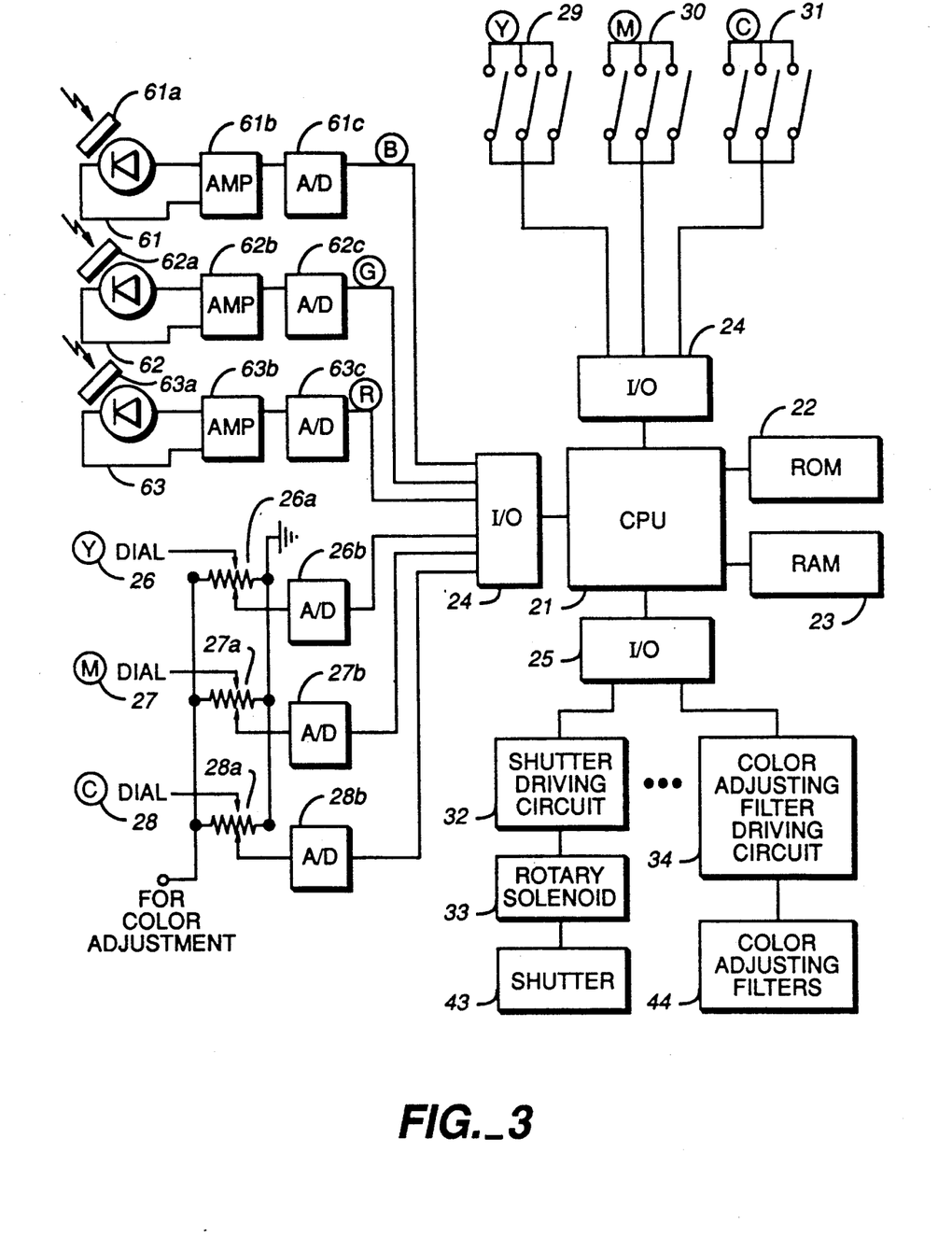
FIG. 3 is a block diagram of a control system of this copier.

An exposure detector 6 is disposed at a position facing the microcapsule-coated surface of the photosensitive sheet which is exposed to the image forming light. This exposure detector 6 is comprised of three kinds of photosensors 61, 62 and 63 facing the exposure light from the light source 41. These photosensors 61-63 may be formed by covering three silicon photodiodes with three kinds of filters (indicated by 61a, 62a and 63a, respectively). The characteristics of these filters 61a-63a may be as shown in FIG. 3, the filter 61a selectively transmitting light in a blue wavelength range, the filter 62a selectively transmitting light in a green wavelength range and the filter 63a selectively transmitting light in a red wavelength range. Accordingly, the photosensor 61 is adapted to detect the amount of light in a blue wavelength range transmitted through the filter 61a, the photosensor 62 is adapted to detect the amount of light in a green wavelength range transmitted through the filter 62a and the photosensor 63 is adapted to detect the amount of light in a red wavelength range transmitted through the filter 63a. A standard white section (a section with high transmissivity or a gap) is provided to the slide film holder 5 and the photosensors 61-63 are so positioned that light passing through this standard white section can reach each of these sensors 61-63 and that the amounts of transmitted light in the blue, green and red wavelength ranges can be detected thereby.

The amounts of light in the wavelength ranges wherein the Y, M and C capsules are individually photosensitive can be accurately detected if the photosensors 61-63 or the filters 61a-63a are selected such that the spectroscopic wavelength characteristics detected by the photosensors 61-63 correspondingly match those of the Y, M and C capsules. Examples of filters 61a-63a that may be used include dichroic filters with color glass plates coated with dielectric layers, color PET (polyethylene terephthalate) and gelatine filters (such as #25, #58 and #47 produced by Kodak).

Disposed inside the copier housing below the light source 41 is a paper cassette 7 containing image transfer sheets which have a surface of their sheet-like base materials coated with a developing agent having a chromogenic effect on each kind of the light-curable agents in the microcapsules on the photosensitive sheet. Each image transfer sheet contained in the cassette 7 is transported to timing rollers 7b by means of a paper supplying roller 7a and is temporarily stopped at the position of the timing rollers 7b. These timing rollers 7b are operated in synchronism with the motion of the photosensitive sheet such that the front edge of the image transfer sheet forwarded by these timing rollers 7b matches the front edge of the exposed area on the photosensitive sheet when these sheets are superposed and transported to the pressure rollers 3 with their surfaces coated with microcapsules and developing agent facing each other. The pressure rollers 3 serve to compress together the photosensitive sheet and the image transfer sheet which are superposed one on top of the other so as to rupture those of the microcapsules on the photosensitive sheet which are not hardened, causing the colorless dyes encapsulated therein to flow out thereof. These dyes react with the developing agent with which the image transfer sheet is coated and produce their specified colors, thereby forming a full-color image on the image transfer sheet.

After passing through the pressure rollers 3, the image transfer sheet is separated from the photosensitive sheet and after it is heated by heat rollers 8, it is discharged into a discharge tray 9 by means of discharge rollers 91. After separated from the image transfer sheet, the photosensitive sheet is taken up, as explained above, by the take-up roller 1b. The chromogenic reaction of the colorless dyes is accelerated by the heating of the image transfer sheet with the heat rollers 8. (See Japanese Patent Publication Tokkai 61-24495.) If the image transfer sheet is preliminarily coated with a thermoplastic resin material, a lustrous image may be obtained. (See Japanese Patent Publication Tokkai 60-259490.)

With reference next to the block diagram of FIG. 3, the overall control of the copier is carried out by a central processing unit (CPU) 21 according to a program preliminarily stored in a read-only memory (ROM) 22. A random-access memory (RAM) 23 is adapted to be used as working areas in the execution of this program and also preliminarily stores a value indicative of the amount of light energy necessary for the formation of image on the image transfer sheet. This value represents the amount of energy necessary for hardening each kind of microcapsules on the photosensitive sheet and may be inputted through dip switches by the user according to the type of the photosensitive sheet, the condition peculiar to the production lot, etc. when the photosensitive sheet is mounted to the holding roller 1a. Since there may be situations where a particularly dark image or a particularly light image is desired, depending on the purpose, color adjusting dials to be described below are also provided such that an amount of light energy corresponding to the desired image density can be inputted when an image is formed.

In summary, the user can not only operate dip switches to set a ratio of amounts of light according to the type of the photosensitive sheet and the condition of its production lot but also set and input such a ratio through dials according to the desired coloring. When a ratio is thus set, one of the filters of the color adjusting filter unit 44 is selectively inserted into the optical path of the image forming light to selectively transmit blue, green or red light. If a reddish image is desired, for example, the ratio for red is reduced. This increases the ratio of insertion into the optical path for filters transmitting colors other than red, thereby reducing the amount of red light. The ratio of hardening C capsules which are sensitive to red is reduced and cyanic becomes strong in the image, producing a reddish image.

Results detected by the photosensors 61-63 of the exposure detector 6 are inputted through an I/O interface 24 to the CPU 21. The amounts of light detected by the photosensors 61-63 are amplified by amplifiers 61b-63b and converted by A/D converters 61c-63c into binary values which are inputted to the CPU 21 through the I/O interface 24.

Dip switches 29, 30 and 31 are disposed near the holding roller 1a for the photosensitive sheet and are adapted to set amounts of light corresponding to the light-curability characteristics of the Y, M and C capsules as well as amounts of light energy. Each dip switch is comprised of three switches and the on-off conditions of these switches can be appropriately combined together to set a ratio according to the type of the photosensitive sheet and the condition of its production lot. The ratio of amounts of light and light energy values are inputted to the CPU 21 through the I/O interface 24. It is recommended that cassettes or other containers of photosensitive sheet be marked with the type and the condition of the sheet stored therein such that the user can set the dip switches 29-31 according to the data thus marked every time a photosensitive sheet is mounted.

Although not shown in FIG. 1, a control panel is disposed on the top surface of the copier housing structure with color adjusting dials 26, 27 and 28 for adjusting yellow, magenta and cyanic colors of the formed image. If these dials 26–29 are rotated, resistance values of variable resistors individually associated therewith are changed, converted into binary numbers by A/D converters 26b–28b and inputted to the CPU 21 through the 1/0 interface 24. The ratio of amounts of light and the amount of light energy can be varied by these dials 26-28 and the coloring characteristics of the formed image can thus be adjusted.

Control data are outputted from the CPU 21 through an I/O interface 25 to a shutter driver circuit 32, a color adjusting filter driver circuit 34, and other circuits. The shutter driver circuit 32 is for opening and closing the shutter 43 for operating a rotary solenoid 33 (not shown). If the shutter 43 is opened, this allows the light from the source 41 to reach the photosensitive sheet to form an image thereon and if the shutter 43 is closed, the light from the source 41 is prevented from reaching the photosensitive sheet. The color adjusting filter driver circuit 34, on the other hand, is for activating a color adjusting filter driver (not shown) to move blue, green and red filters into the optical path of image forming light so as to appropriately adjust the ratio of amounts of color light.

Figure 4:
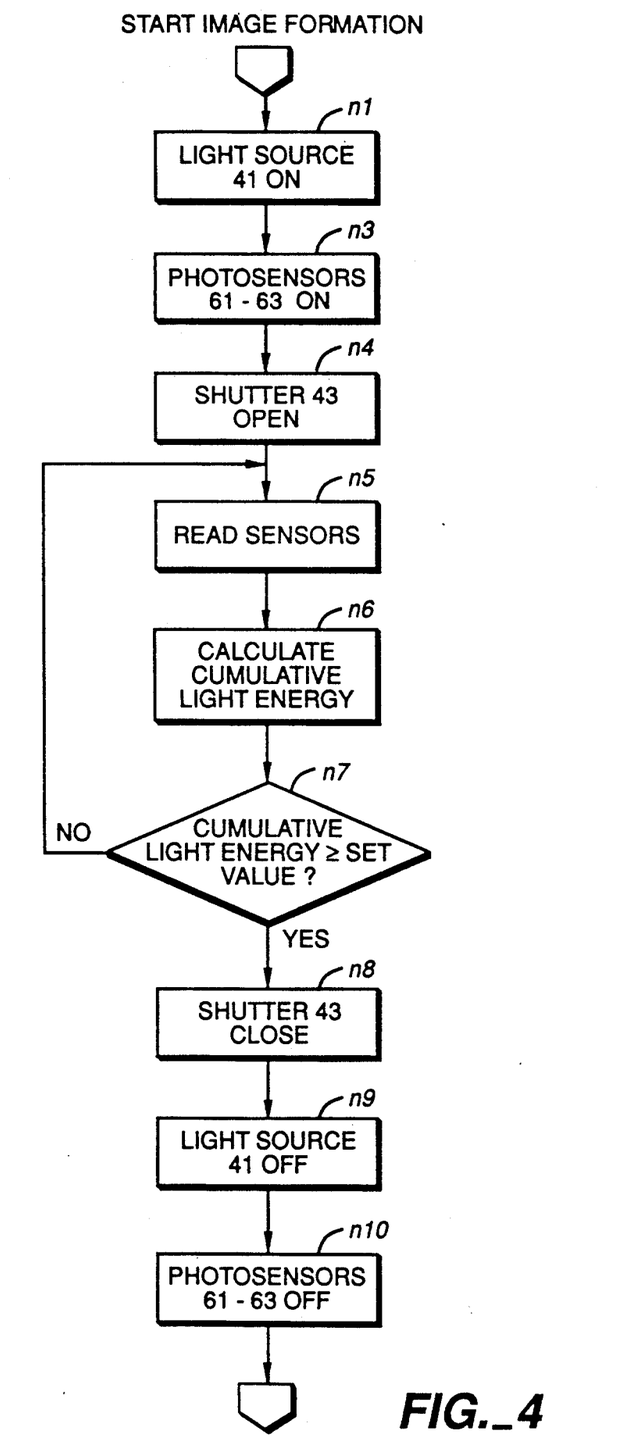
FIG. 4 is a flow chart of image forming exposure operation of this copier.

With reference next to the flow chart of FIG. 4 for showing the image forming exposure operation of this copier on its photosensitive sheet, when a print switch (not shown) is operated to output a start signal indicative of a start of an image forming exposure operation, not only are the light source 41 and the photosensors 61-62 switched on (n1 and n3) but also the rotary solenoid 33 is switched on to open the shutter 43 such that an image forming exposure is started on the photosensitive sheet (n4). If the dip switches 29-31 or the dials 26-28 are operated, the color adjusting filters are correspondingly moved into the optical path of the exposure light.

After the image forming exposure operation is thus started, the results of detection by the photosensors 61-63 are sequentially read at constant time intervals (n5). Amounts of light energy corresponding to blue, green and red wavelength ranges are obtained and added to calculate an integrated light energy value (n6). The integrated light energy value thus calculated is compared with a preset light energy value. If the integrated light energy value is less than the preset light energy value, the shutter 43 is kept open and the photosensitive sheet continues to be exposed. When the integrated light energy value reaches this preset value, a shutter close signal is outputted to the shutter driver circuit 32 (n8), activating the rotary solenoid 33 to close the shutter 43 and to switch off the light source 41 and the photosensors 61-63 (n9 and n10). This completes the image forming exposure operation on the photosensitive sheet.

In summary, exposure of the photosensitive sheet is continued until the preset amount of light energy is projected thereonto. Thus, even if the light source 41 has deteriorated with time and its rate of light emission has decreased, the photosensitive sheet can always receive a sufficient amount of light energy. The preset amount may be a standard value preliminarily inputted to and stored in the RAM 23, a value depending on the kind of the photosensitive sheet or the characteristics of its production lot set and inputted through the dip switches 29-31, or a value selected by the user and inputted through the color adjusting dials 26-28. It is thus possible to always obtain an image of a desired quality with a sufficient amount of light energy. The filters of the color adjusting filter unit 44 are moved according to the setting through the dip switches 2931 or the color adjusting dials 26-28 and since the ratio of blue, green and red light energy can be varied, images with no particular coloring as well as images with a desired color characteristic can be obtained. The ratio in the amount of light can be checked by means of the photosensors 61-63.

Figure 5:
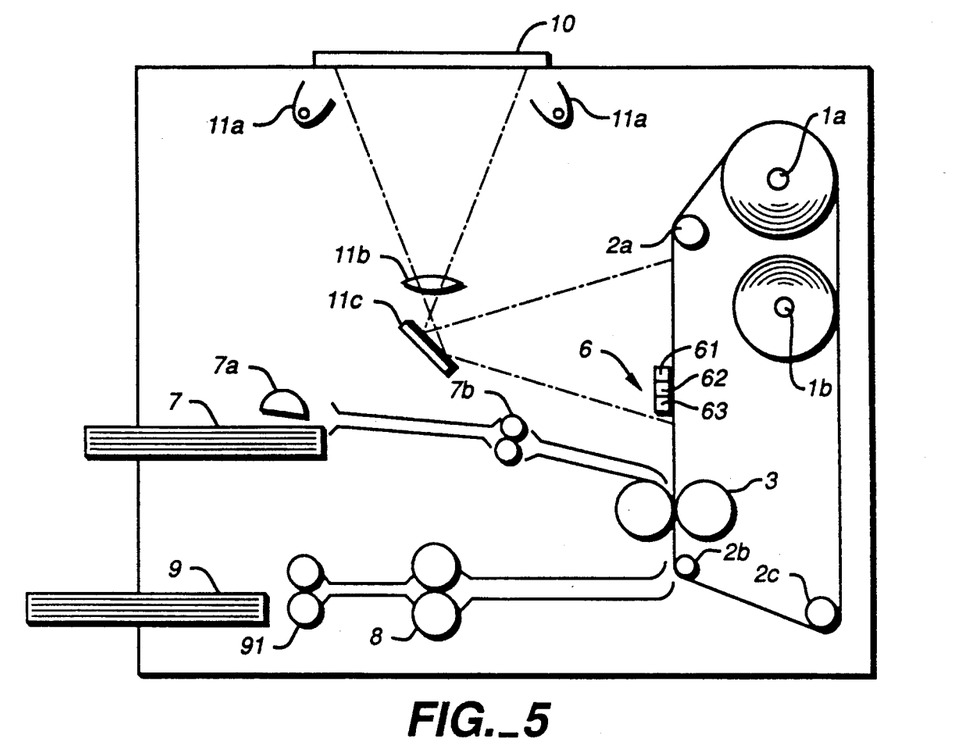
FIG. 5 is a schematic drawing showing the structure of another copier embodying the present invention.

Although the present invention has been described above by way of a copier of the type exposing a photosensitive sheet to a beam of transmitted light through a slide film, the present invention can also be applied to a copier of the type shown in FIG. 5 adapted to focussing reflected light from a document on a photosensitive sheet. The copier shown in FIG. 5 has a document table 10 formed on the top surface of its housing structure such that a document to be copied by this copier is placed thereon and exposed to light from a pair of light sources 11a. Reflected light therefrom is directed by a lens 11b and a mirror 11c to the photosensitive sheet. The photosensitive sheet is mounted to a holding roller 1a and is pulled out approximately vertically therefrom. The reflected light from the original document to be copied is projected onto the photosensitive sheet where it is substantially vertical. In the other aspects, the copier shown in FIG. 5 is similar to the one described above by way of FIG. 1 and hence will not be explained again. Components which are substantially the same as or equivalent to those shown in FIG. 1 are indicated by the same numerals. The document table 10 is provided with a standard white section although not shown in FIG. 5 and reflected light from this standard white section is detected by photosensors 61-63 of an exposure detector. The original document on the document table 10 continues to be exposed to light from the sources 11a and the photosensitive sheet continues to be exposed to the reflected light until the integrated value of the amount of light energy detected by the photosensors 61-63 reaches a preset value. When the integrated value of the light energy detected by the photosensors 61-63 reaches the present value, the light sources 11a are switched off and image forming exposure of the photosensitive sheet is terminated.

With either of the copiers shown in FIGS. 1 and 5, the ratio in amount of light in the blue, green and red wavelength ranges is obtained from the results of detection by the photosensors 61-63 and ill effects of deteriorated conditions of the light source 41 or 11a on the color balance of the formed image can be thereby prevented. As explained above, the spectroscopic distribution characteristics of light sources such as halogen tungsten lamps deteriorate with time and this adversely affects the color balance of the formed image. Thus, the ratio in amount of light in different wavelength ranges is obtained from the photosensors 61-63 of the exposure detector 6 and if this ratio fails to stay within a preset allowable range, a warning may be outputted or the image forming process itself may be stopped such that formation of images with poor color balance can be prevented.

When a light source with color temperature of about 3200° K was used, for example, the aforementioned ratio in the amount of light in the blue, green and red wavelength ranges was about 1:2:3 while this source was new and there was no deterioration with time. Near the end of its useful lifetime, the ratio between the blue and red wavelength ranges was 1:3.35 (instead of the initial ratio of 1:3). This means a change of about 10% in the spectroscopic ratio. On the basis of this experimental result, the copier may be so set that a warning signal be outputted if a 10% change in the ratio between the blue and red wavelength ranges has been detected such that the user can learn that the light source is near its useful lifetime.

Although production of images with adversely affected color balance can be prevented as explained above by means of a warning device or even by stopping the operation of the copier altogether when the change in the aforementioned ratio becomes significant, it is also possible to obtain images with good color balance if the filters of the color adjusting filter unit 44 are inserted according to the measured change in the ratio, thereby counteracting the measured change. According to the embodiments described above, three photodetectors 61-63 are in the exposure detector 6 for detecting the amounts of light in the wavelength ranges corresponding to blue, green and red but this is not intended to limit the scope of this invention. Alternatively, use may be made of a single photosensor for the visible range together with filters which individually transmit blue light, green light and red light. The amounts of light in the wavelength ranges of these three colors can be sequentially measured with such a device. This embodiment has the advantage of requiring fewer sensors, amplifier circuits and other components and hence reducing the overall cost of the copier.

Figure 6:
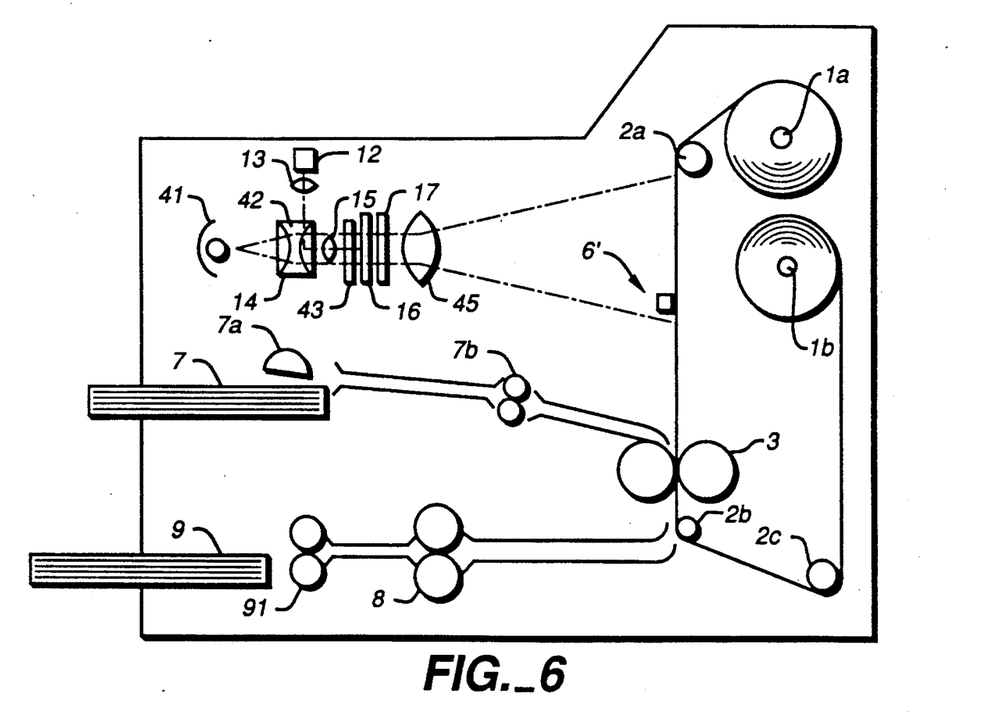
FIG. 6 is a schematic drawing showing the structure of still another copier embodying the present invention.
Figures 7, 8:
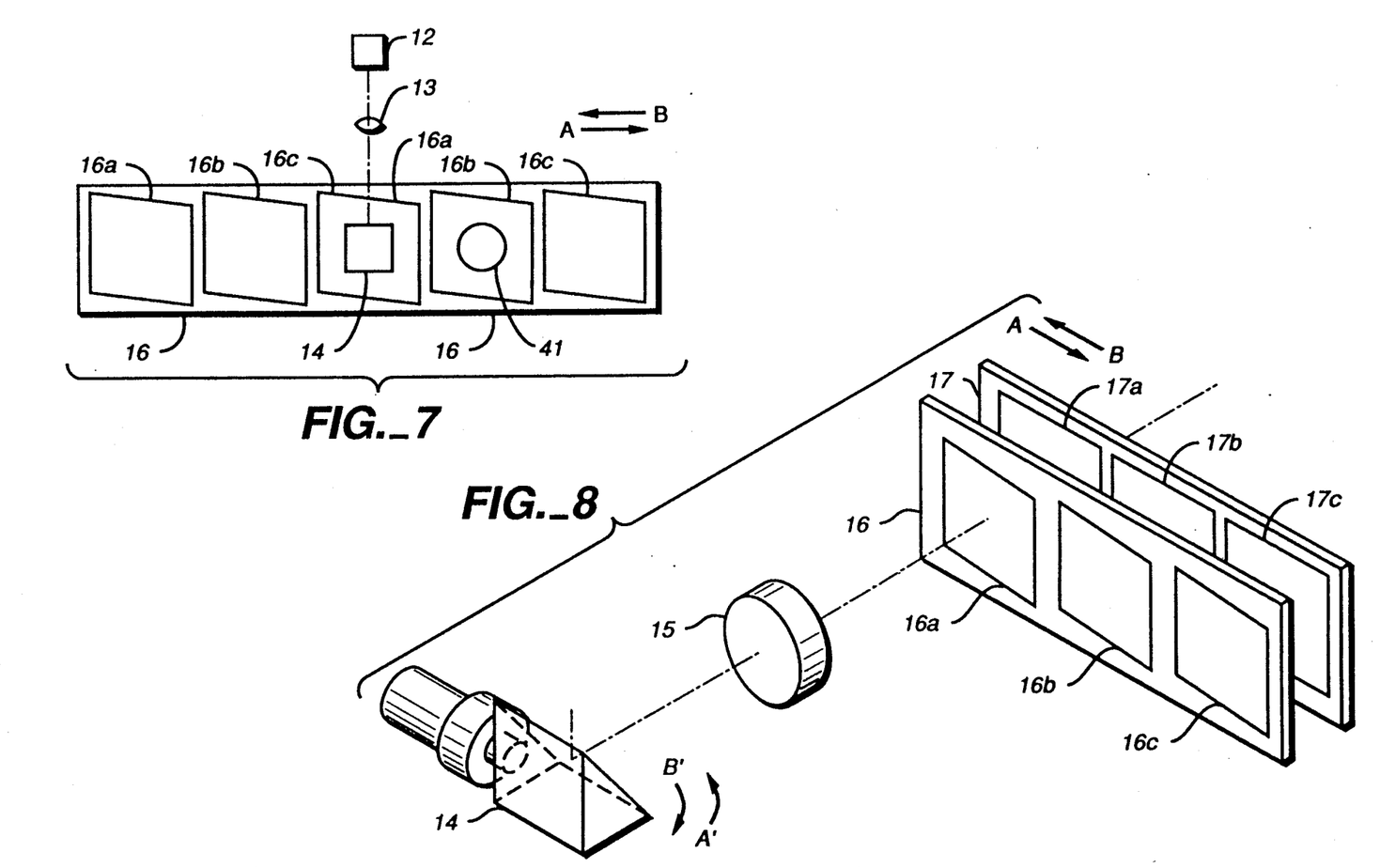
FIG. 7 is a side view of the optical system of the copier of FIG. 6.
FIG. 8 is a diagonal view of the optical system of FIG. 7.

FIG. 6 shows a copier as another embodiment of the present invention characterized by its image forming operation by decomposing incoming image forming light in the entire visible range into a blue light component, a green light component and a red light and making three image forming exposures in these three wavelength ranges. With reference to FIG. 6 in which substantially identical or at least similarly functioning components are again indicated by the same numerals for convenience, the photosensitive sheet mounted on the holding roller la is pulled substantially vertically downward therefrom as in the copiers described above and the optical system serves to expose this vertical photosensitive sheet to image forming light. The optical system according to this embodiment includes an imaging section disposed halfway towards the back of the copier housing structure and a writing section disposed further backward from the imaging section. FIG. 7 is a side view of the optical system and FIG. 8 is a diagonal view of the writing section. The writing section is where an image to be obtained is written on a light transmissive liquid crystal panel 16 and the imaging section serves to expose this liquid crystal panel to light to form a beam of image forming light to be made incident on the photosensitive sheet.

The writing section is comprised of a laser diode 12, a collimator lens 13, a galvano-mirror 14 and a focussing lens 15 which are used for writing an image on the liquid crystal panel 16. The laser diode 12 is controlled by a control unit (not shown) to emit laser heat which is directed through the collimator lens 13, the galvano-mirror 14 and the focussing lens 15 to form an image on the liquid crystal panel 16. The liquid crystal panel may comprise a smectic liquid crystal cell, having three image forming surfaces 16a, 16b and 16c. The liquid crystal panel 16 is movable in the directions shown by arrows A and B in FIGS. 7 and 8 by means of a linear motor and a linear encoder (not shown). Arrows A' and B' show the angular directions in which the galvano-mirror 14 can be moved.

When an image is to be written on the liquid crystal panel 16 thus structured, the panel 16 is moved along the arrow A or B such that one of the image forming surfaces is within the optical path of the laser heat emitted from the laser diode 12. The laser diode 12 is adapted to receive a color image forming signal from a control unit (not shown) and emits laser heat according to such a received signal. The color image forming signal is obtained by decomposing a full color image information into different colors such as yellow, magenta and cyanic, or by decomposing data read by an image scanner on the basis of individual colors. When a first image forming surface 16a is set in the optical path, laser heat is projected on the basis of yellow image data, when a second image forming surface 16b is set in the optical path, laser heat is projected on the basis of magenta image data and when a third image forming surface 16c is set in the optical path, last heat is projected on the basis of cyanic image data. As a result, images corresponding respectively to yellow, magenta and cyanic are formed on these image forming surfaces 16a, 16b and 16c. While laser heat is projected, the liquid crystal panel 16 is moved in the directions of A and B while the galvano-mirror is rotated in the directions of arrows A' and B' such that the liquid crystal panel effectively two-dimensionally moves with respect to the laser heat path. In this manner, the laser heat scans each of the image forming surfaces 16a-16c of the liquid crystal panel 16, writing images thereon. They are contrasty images with differences in transmissivity.

The imaging section includes not only a light source 41, a condenser lens system 42, a shutter 43 and a focussing lens 44 as does the copier shown in FIG. 1 but also a filter unit 17 such that light emitted from the light source 41 passes through the condenser lens system 42, the shutter 43, the liquid crystal panel 16, the filter unit 17 and the focussing lens 44 to form an image on the photosensitive sheet. The filter unit 17 and the liquid crystal panel 16 are supported unistructurally such that they move together in the directions of A and B. As shown in FIG. 8, the filter unit 17 has three selectively transmitting surfaces 17a, 17b and 17c, each transmitting light in a specified wavelength range.

One of them (17a) selectively transmits light in a blue wavelength range, another (17b) selectively transmits light in a green wavelength range and the third (17c) selectively transmits light in a red wavelength range.

As explained above, contrasty images with different transmissivities in yellow, magenta and cyanic are formed on the image forming surfaces 16a-16c of the liquid crystal panel 16. When light is passed through these contrasty images to form their focussed images on the photosensitive sheet to thereby form thereon a latent image with color information by selectively hardening the microcapsules thereon, the light source 41 is switched on initially with the first image forming surface 16a positioned in its path, thereby exposing the photosensitive sheet to light which carries the contrasty image on the first image forming surface 16a with yellow image data and passes through the first selective transmitting surface 17a. Since the first selective transmitting surface 17a passes only light of blue which is complementary to yellow, only those of the Y capsules on the photosensitive sheet exposed to this light are selectively hardened. If the light source 41 is switched on next with the second image forming surface 16b and the second transmitting surface 17b set in the optical path, M capsules on the photosensitive sheet are selectively hardened by the green light through the second transmitting surface 17b and, similarly, if the light source 41 is switched on with the third image forming surface 16c and the third transmitting surface 17c in its optical path, C capsules on the photosensitive sheet are selectively hardened by the red light through the third transmitting surface 17c. Thus, after these three image forming exposures, Y, M and C capsules are selectively hardened to form a latent image with color information on the photosensitive sheet.

Figure 9:
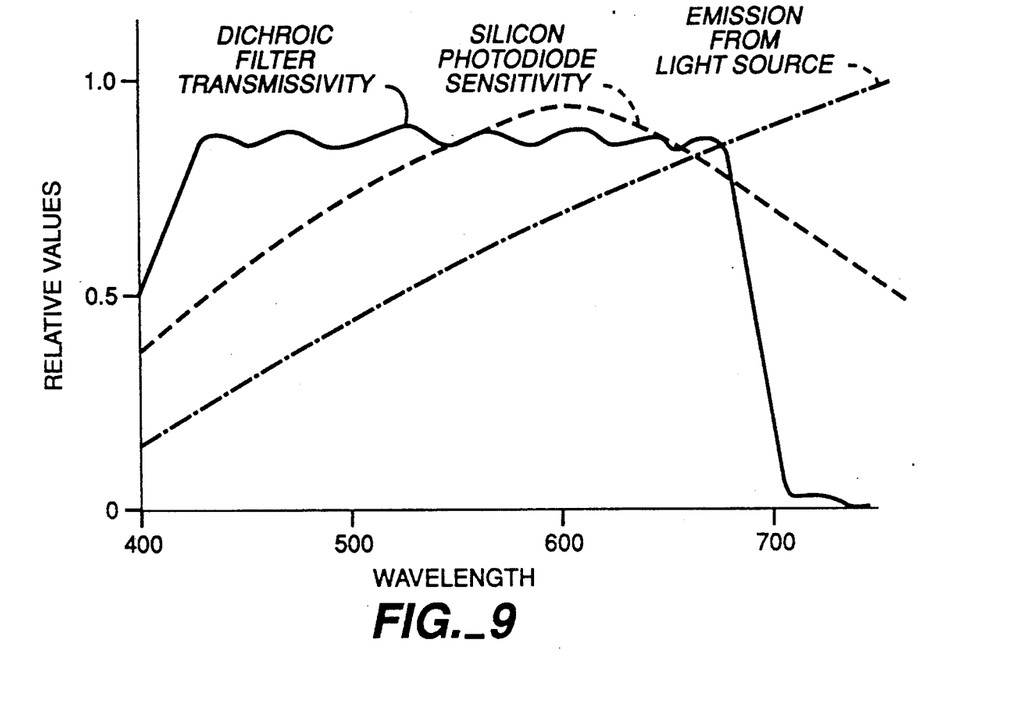
FIG. 9 is a graph showing the characteristics of the silicon photodiode and the dichroic filter of the exposure detector used in the copier of FIG. 6.

As shown in FIG. 6, an exposure detector 6' is disposed at a position opposite to the photosensitive sheet corresponding to the imaging section. A standard white section (not shown), as explained above in connection with another embodiment of the present invention, is provided to the liquid crystal panel 16 and the filter unit 17 such that the amount of light transmitted through these standard white sections is detected by this exposure detector 6'. The exposure detector 6' may be a silicon photodiode covered with a dichroic filter. As can be understood from FIG. 9 which shows the characteristics of a silicon photodiode and a dichroic filter used in an exposure detector, the silicon photodiode is sensitive over a wide wavelength range but the dichroic filter is transmissive to light only in a limited wavelength range of about 400–700 nm. The exposure detector 6' thus formed is therefore capable of detecting the amount of light (light energy) only within a wavelength range which can harden the microcapsules on the photosensitive sheet. For reference, FIG. 9 also shows the spectroscopic emission characteristics of the light source 41.

In the control unit for this copier, the amounts of red blue light, green light and red light which are required to harden microcapsules for forming a latent image on the photosensitive sheet are preliminarily stored in a RAM. The RAM also stores corresponding energy data for different kinds of photosensitive sheet and their conditions (by production lot). Energy values of light of different colors which are necessary for exposure to form images with different coloring according to the user's wishes can also be inputted.

Energy values set in the RAM may be, for example, 0.6 mJ/cm$^2$ for blue light, 1.2 mJ/cm$^2$ for green light and 1.8 mJ/cm$^2$ for red light. The liquid crystal panel 16 and the filter unit 17 are moved and the photosensitive sheet is exposed therethrough sequentially to blue light, green light and red light until the measured amount of light of each color reaches the standard value stored in the RAM. The time required for exposure of light of each color is approximately 4.5 sec for blue light, 5.5 sec for the green light and 5.0 sec for red light. Thus, with standard light energy values for blue, green and red preliminarily set before the photosensitive sheet is exposed, the exposure time for light of each color is appropriately adjusted and the photosensitive sheet is always exposed correctly.

Figure 10:
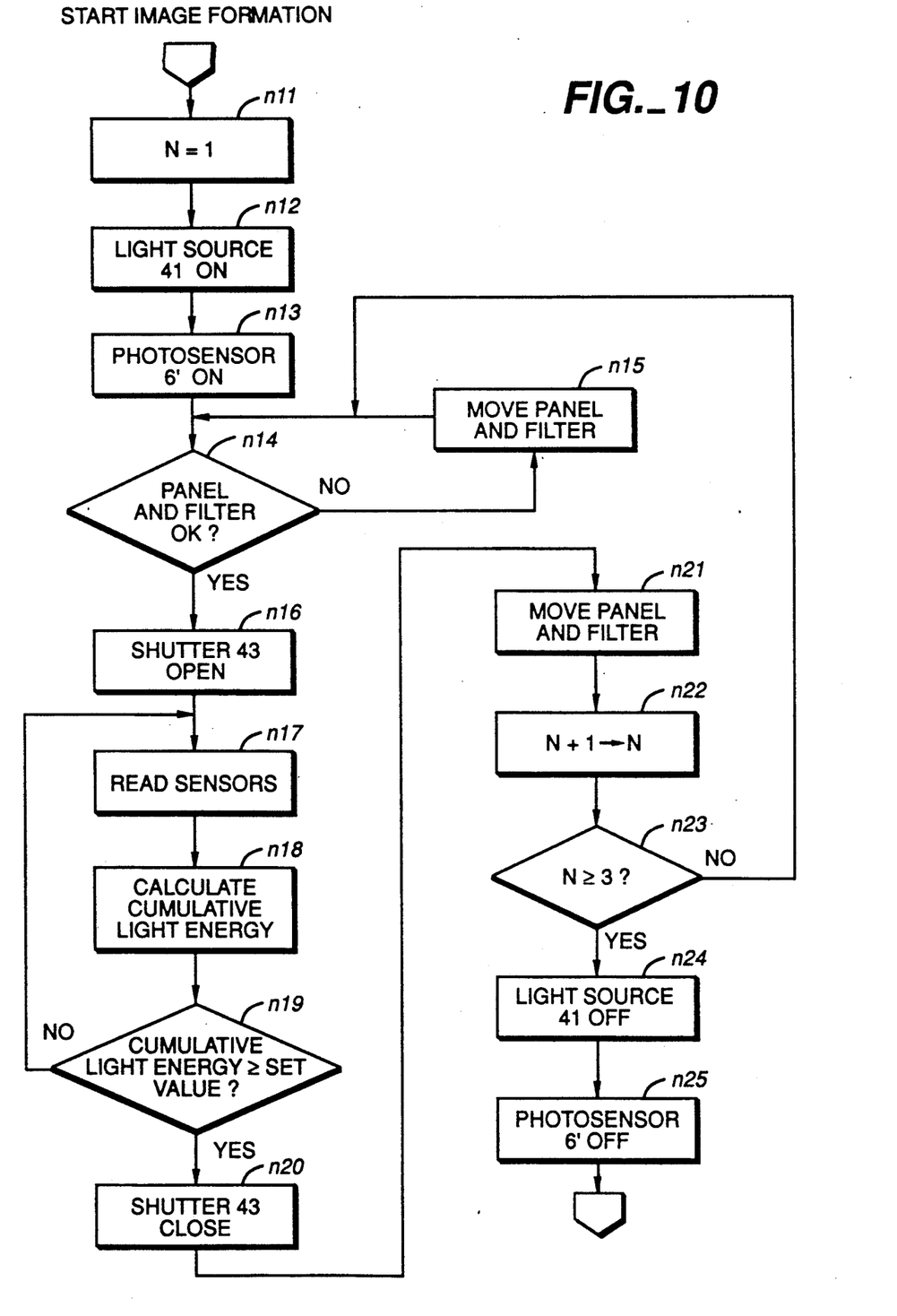
FIG. 10 is a flow chart of image forming exposure operation of the copier of FIG. 6.

The control program of image formation operation for this copier is explained next by way of the flow chart shown in FIG. 10 wherein the steps of image forming exposure to blue light, green light and red light are respectively indicated by N=1, 2 and 3.

When a print switch on the operation panel is pressed and a start signal is thereby outputted, the indicator variable N is initially set to 1 (n11) and both the light source 41 and the photosensors 61–63 are switched on (n12 and n13). If the liquid crystal panel 16 and the filter unit 17 are not correctly positioned with respect to the light source 41 (NO in no14), they are moved such that the correct ones of the image forming surfaces and the light transmitting surfaces are placed in the optical path of the light source 41 (n15). The shutter 43 is opened (n16) to start the first exposure if the liquid crystal panel 16 and the filter unit 17 are correctly positioned (YES in n14). If N=1, the photosensitive sheet is thereby exposed to light through the first image forming surface 16a and the first light transmitting surface 17a.

As soon as the image forming exposure starts, the photosensor of the exposure detector 6' detects the amount of light energy in the wavelength range corresponding to the transmissivity characteristics of the first transmitting surface 17a. The detected light energy level is sequentially inputted in the CPU at constant time intervals (n17). The CPU serves to thereupon add the inputted energy values to calculate an integrated amount of light, or the cumulative energy value (n18). If this cumulative energy value reaches the aforementioned standard value (YES in n19), the shutter 43 is closed (n20) to end the exposure to light of that color (blue, for example, if N=1). At this time, the unistructured liquid crystal panel 16 and filter unit 17 are moved (n21) to position the next (second) image forming surface 16b and light transmitting surface 17b in the optical path of the light source 41 in preparation for the next image forming exposure to light of another color (green). The indicator number N is incremented (n22) and unless N has reached 3 (NO in n23), the next cycle of image forming exposure to light of another color is carried out (n14–n22). If N has reached 3 (YES in n23), the light source 41 and the photosensor of the exposure detector 6' are switched off (n24 and n25) to conclude the image forming exposure operation.

Figure 11:
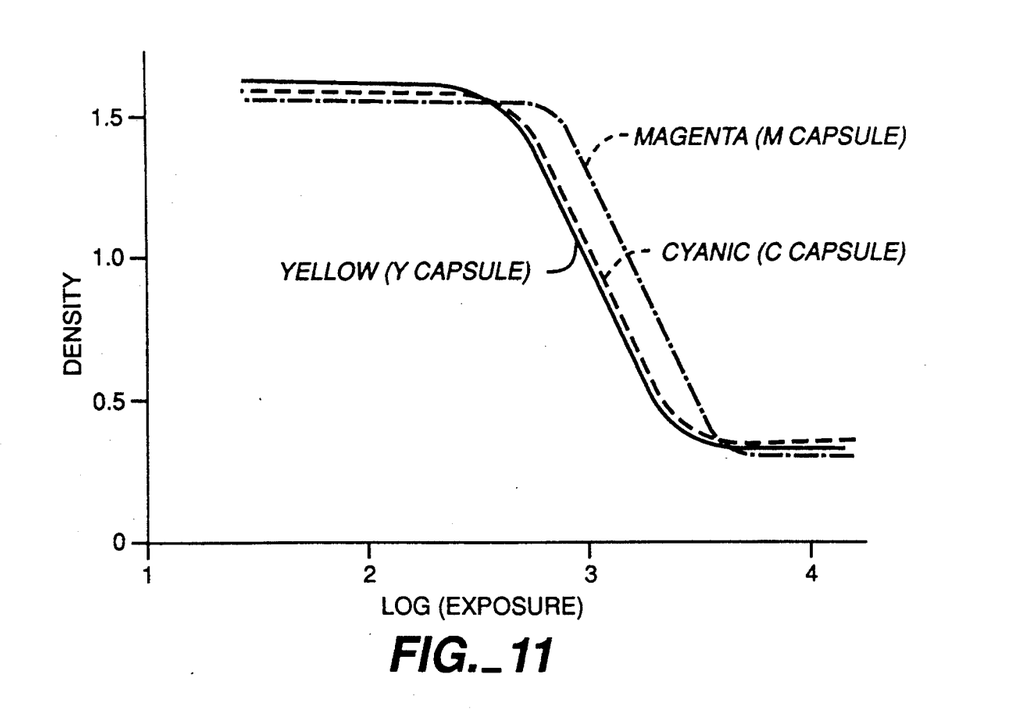
FIG. 11 is a graph showing an example of characteristics of a photosensitive sheet.

A latent image is thus formed on the photosensitive sheet by exposing it to light of each wavelength range until a set amount of energy corresponding to the color of that wavelength range is received. Although such set amounts are preliminarily stored in the RAM, the image obtained as described above may still not be of desired quality, depending on the type of the photosensitive sheet being used or the particular condition it happens to be in (such as the production lot characteristics). FIG. 11 shows the light-curability characteristics of a photosensitive sheet. Yellow, magenta and cyanic images were formed for testing on the image forming surfaces 16a–16c of the liquid crystal panel 16 with density scale in the range of 0.05–2.05 and the relationship between exposure when this panel was used for image formation and the density of colors chromogenically produced by the colorless dyes encapsulated in the Y, M and C capsules of the photosensitive sheet is shown in FIG. 11. The energy levels were set as before at 0.6 mJ/cm$^2$, 1.2 nJ/cm$^2$ and 1.8 mJ/cm$^2$ respectively for blue, green and red light. FIG. 11 shows that the gamma (slope which shows the relationship between exposure and density) is approximately the same among the three kinds of capsules but since the sensitivity of the M capsule is lower than that of the C capsule and the Y capsule by about 0.6, exposure to the M capsules must be increased in order to produce magenta from the M capsules at equal density as cyanic from the C capsules and yellow from the Y capsules. Thus, if exposure is carried out according to the values set as above, the obtained image becomes strong in red and blue. In other words, if use is made of a photosensitive sheet characterized by FIG. 11, the M capsules must be hardened more, corresponding to 0.6 in density scale and the set value for exposure to green light should be changed to $1.2 \times 10^{0.6} = 4.78 (mJ/cm^2)$. The exposure time for green in this case becomes about 22 seconds.

According to the present invention, the amount of blue, green and red light to be set can be varied according to the characteristics of the photosensitive sheet and the exposure time can accordingly be adjusted. Thus, it is possible to prevent any particular color to appear too strongly on the produced image and, in reverse, to produce a image with a specified color appearing strongly.

The foregoing description of preferred embodiments of the invention has been presented for purposes of illustration and description. It is not intended to be exhaustive or to limit the invention to the precise form disclosed, and many modifications and variations are possible in light of the above teaching. Any such modifications and variations that may be apparent to a person skilled in the art are intended to be included within the scope of this invention.

What is claimed is:

1. In an image forming apparatus of a static exposure type for forming a latent image by exposing a photosensitive body to image forming light by an optical system of a static exposure type and forming a visible image from said latent image on said photosensitive body, the improvement wherein said photosensitive body is a photosensitive sheet having one surface of sheet-like base material thereof coated with microcapsules encapsulating a light-curable agent and a colorless dye, and wherein said apparatus further comprises an exposure detector disposed at a position facing said photosensitive body for detecting exposure of said photosensitive body when said photosensitive body is exposed to image forming light, and a control unit for continuing image forming exposure of said photosensitive body until the cumulative light energy of exposure of said photosensitive body according to said exposure detector reaches a set value.

2. The image forming apparatus of claim 1 wherein said set value is preliminarily determined according to characteristics of said photosensitive body.

3. The image forming apparatus of claim 1 wherein said set value is inputted through an inputting means for inputting values.

4. The image forming apparatus of claim 1 wherein each of said microcapsules encapsulates one of a plurality of kinds of light-curable agent and a colorless dye, each of said kinds of light-curable agent hardening upon exposure to light in a specified wavelength range, said colorless dye producing a color which is complementary to the color corresponding to said wavelength range to which said light-curable agent is photosensitive.

5. The image forming apparatus of claim 4 wherein said photosensitive sheet is exposed by said optical system to image forming light of entire visible wavelength range all at once.

6. The image forming apparatus of claim 4 wherein said photosensitive sheet is exposed separately by said optical system to blue light, green light and red light into which image forming light of entire visible wavelength range is decomposed.

* * * * *